(12) United States Patent
Becker

(10) Patent No.: US 6,174,225 B1
(45) Date of Patent: Jan. 16, 2001

(54) DRY ICE PELLET SURFACE REMOVAL APPARATUS AND METHOD

(75) Inventor: James R. Becker, North Ridgeville, OH (US)

(73) Assignee: Waste Minimization and Containment Inc., Cleveland, OH (US)

(*) Notice: Under 35 U.S.C. 154(b), the term of this patent shall be extended for 0 days.

(21) Appl. No.: 08/969,579

(22) Filed: Nov. 13, 1997

Related U.S. Application Data

(60) Provisional application No. 60/037,033, filed on Feb. 5, 1997.

(51) Int. Cl.$^7$ ........................................................ B24C 3/00
(52) U.S. Cl. ............................ 451/75; 451/39; 451/99; 451/88
(58) Field of Search ........................... 451/39, 99, 102, 451/75, 88, 87, 100, 97

(56) References Cited

U.S. PATENT DOCUMENTS

| | | | |
|---|---|---|---|
| 2,953,875 | * | 9/1960 | Mead ........................................ 451/75 |
| 3,540,156 | * | 11/1970 | Stebbins et al. ........................ 451/39 |
| 3,828,478 | * | 8/1974 | Bemis ....................................... 451/11 |
| 4,389,820 | | 6/1983 | Fong et al. . |
| 4,617,064 | | 10/1986 | Moore . |
| 4,780,119 | | 10/1988 | Brooke . |
| 5,184,427 | | 2/1993 | Armstrong . |
| 5,203,794 | * | 4/1993 | Stratford et al. ........................ 451/51 |
| 5,357,718 | * | 10/1994 | Kanno ..................................... 451/39 |
| 5,445,553 | * | 8/1995 | Cryer et al. ............................. 451/39 |
| 5,503,198 | | 4/1996 | Becker . |
| 5,531,634 | * | 7/1996 | Schott .................................... 451/39 |
| 5,839,951 | * | 11/1998 | Tomioka ................................ 451/88 |
| 5,853,128 | * | 12/1998 | Bowen et al. ........................ 451/39 |

\* cited by examiner

Primary Examiner—David A. Scherbel
Assistant Examiner—Lee Wilson
(74) Attorney, Agent, or Firm—Fay Sharpe Fagan Minnich & McKee

(57) ABSTRACT

An apparatus for removing surface coverings comprises a feeder device capable of providing a supply of dry ice pieces, a pellet-size reducer operatively associated with the feeder device to receive dry ice pieces from said feeder device and reduce the size of the dry ice pieces to nominal diameters less than 1 mm, and a blast gun connected to the pellet-size reducer and adapted for operative communication with an associated supply of flowing gas. The blast gun incorporates a venturi to entrain the reduced-sized dry ice pieces into the flowing gas and directs the flowing gas and dry ice pieces to an associated surface covering to be removed. Preferably, the pellet-size reducer is a knife- or disc-type grinding mill. In one embodiment, the grinding mill is adjustable for controlling the size of the dry ice particles supplied to the blast gun. The apparatus preferably includes a humidity controller to suppress static charges caused by the interaction of the dry ice particles with the surface being blasted.

33 Claims, 5 Drawing Sheets

DRY ICE PELLET SURFACE REMOVAL APPARATUS AND METHOD

This application claims priority from U.S. Provisional Patent Application Ser. No. 60/037,033, filed Feb. 5, 1997.

BACKGROUND OF THE INVENTION

The present invention relates to an apparatus and method for removing surface coverings by blasting with dry ice pellets. In particular, the present invention relates to an apparatus for removing surface coverings using reduced-size dry ice pellets that is especially suitable for use in the production of electronic devices.

The use of dry ice pellets for blast cleaning is well known in the art. Examples of conventional pneumatically powered blast cleaning systems are described in U.S. Pat. No. 4,389,820 and U.S. Pat. No. 5,365,699, which are incorporated herein by reference.

In such systems, pellets of dry ice (solidified $CO_2$) are drawn into a flowing gas stream (typically compressed air) by the action of a venturi in a blast gun, where they are entrained into the gas stream and propelled out of the gun to impinge against the surface to be cleaned. After the pellets collide with the surface, removing unwanted surface coverings by their impact, they sublimate into gaseous $CO_2$ and become part of the ambient atmosphere. The only residue from this process is the removed surface covering.

The dry ice pellets typically are produced by machines called pelletizers. Conventional examples of these machines are disclosed in U.S. Pat. No. 4,780,119 and U.S. Pat. No. 5,475,981, which are incorporated herein by reference. In these machines, liquid $CO_2$ is injected into a cylinder, where it solidifies in the form of snow-like solid $CO_2$ particles. A piston within the cylinder then compresses the solidified $CO_2$ and extrudes rod-shaped dry ice through orifices in a die at one end of the cylinder. The dry ice rods are either sliced during extrusion or further broken down to form pellets. The pellets used for typical dry ice blasting vary in size depending on the surface conditions to be treated. Rice-sized pellets (about 3–3.5 mm in diameter) are useful for cleaning paint and other surface coverings that might otherwise be cleaned by sand blasting. The smallest pellets produced by conventional means are about 1–2 mm in diameter.

In the manufacture of semiconductors, printed circuit boards, flat-panel displays, and other products in the electronics industry, extremely thin layers of material often must be removed in precisely defined, narrow strips to achieve the desired thin-film configuration or circuitry. Traditionally, etching by acid solutions or by photo-chemical mechanisms has been used in manufacturing these products. For example, in producing a printed circuit board, a thin conductive film is deposited on a substrate, a patterned deposition of "resist" material is made, and the acid or other etching medium is applied. Because the resist material is resistant to the etching process, only the exposed conductor is removed, leaving the resist-covered conductor to serve as the desired circuit.

The electronics industry also has used sand-blasting techniques to produce the desired circuit patterns for some applications, such as flat panel displays. Because of the small dimensions of the circuits, however, sand having a diameter on the order of one micron (0.001 mm) must be used. Using sand blasting techniques to manufacture such products, however, has several drawbacks. For example, the process results in considerable sand residue. In addition, the special micron-size sand is expensive. Furthermore, static charges created by the interaction of the sand with the resist material or the material being removed can damage the resulting electronic circuit.

Although dry ice pellets might be applicable to electronic circuit manufacture without the inherent drawbacks of sand blasting, it is not possible to use conventional dry ice blasting techniques. The basic problem is that conventional pelletizers cannot be used to produce the small-diameter pellets required to remove such finely defined circuit patterns. Solidified $CO_2$ cannot readily be extruded through sub-millimeter-sized orifices in a die.

Another application in which conventional sand blasting and $CO_2$ pellet blasting techniques do not work well is in the cleaning of thin layers of metal, for example, in preparation for surface plating of copper layers. The high kinetic energy of these conventional blasting media unacceptably deforms or damages the thin layers during cleaning. Dry ice pellets of smaller mass are required for this application.

A third application in which conventional techniques do not work well is in the cleaning of flux and solder from printed circuit boards. The primary problem with conventional blasting systems is the static charges that are created from the interaction of the relatively dry cleaning media with the circuit boards. These static charges cause severe damage to the electronic components mounted on the boards.

This invention is intended, therefore, to provide a method and apparatus for producing dry ice pellets having a diameter less than 1000 microns (1 mm). The invention also is intended to provide a method and apparatus for removing small-dimensioned surface areas using such sub-millimeter-sized dry ice pellets. Furthermore, this invention is intended to provide an apparatus and method for controlling pellet size so that a single blasting machine can be used for a variety of applications in which optimum pellet size varies. In addition, this invention is intended to provide an apparatus and method for limiting the static charges created during cleaning with dry ice pellets.

Additional advantages of the present invention will be set forth in part in the description that follows, and in part will be obvious from that description or can be learned by practice of the invention. The advantages of the invention can be realized and obtained by the apparatus and method particularly pointed out in the appended claims.

SUMMARY OF THE INVENTION

The present invention overcomes the problems of prior art surface removal devices by utilizing a size-reducing mill in a dry ice blasting apparatus to reduce the size of the dry ice particles before they reach the blast gun. In one embodiment of the invention, this mill provides for adjusting the size reduction at the blasting site. Further reduction in pellet size can be accomplished, if desired, by the configuration used in the blast nozzle. This invention also contemplates controlling the humidity, temperature, and pressure of the propellant gas to optimize conditions where the pellets impact the surface to remove the desired layers of material.

To overcome the problems of the prior art surface-removal processes, and in accordance with the purpose of the invention, as embodied and broadly described herein, the apparatus of this invention for removing surface coverings comprises a feeder device capable of providing a supply of dry ice pieces, a pellet-size reducer operatively associated with the feeder device to receive dry ice pieces from the feeder device and reduce the size of the dry ice pieces to nominal diameters less than 1 mm, and a blast gun connected to the pellet-size reducer and adapted for operative communication with an associated supply of flowing gas. The blast gun entrains the reduced-size dry ice pieces into the flowing gas and directs the flowing gas and dry ice pieces to an associated surface covering to be removed.

Preferably, the pellet-size reducer includes a knife- or disc-type grinding mill. In addition, the preferred embodiment of the apparatus includes a humidity controller operatively associated with the blast gun to control the moisture content of the flowing gas directed by the blast gun.

In one preferred embodiment of the invention, the apparatus comprises a supply of flowing gas; a feeder device capable of providing a supply of dry ice pieces; a pellet-size reducer operatively associated with the feeder device to receive dry ice pieces from the feeder device and reduce the size of the dry ice pieces to nominal diameters less than 1 mm; and a blast gun having a primary flow path defined by an inlet connected to the flowing-gas supply, an outlet, a venturi intermediate the first inlet and the outlet, and at least one dry ice port connected to the pellet-size reducer and opening into the primary flow path intermediate the venturi and the outlet. In operation, the pressure of gas flowing from the inlet to the outlet decreases proximate the position where the dry ice port opens into the primary flow path and causes the reduced-size dry ice pieces to be drawn through the dry ice port into the primary flow path and to exit the outlet entrained in the flowing gas.

The accompanying drawings, which are incorporated in and which constitute a part of this specification, illustrate at least one embodiment of the invention and, together with the description, explain the principles of the invention.

DESCRIPTION OF THE PREFERRED EMBODIMENTS

Reference now will be made in detail to the presently preferred embodiments of the invention, examples of which are illustrated in the accompanying drawings.

Figure 1:
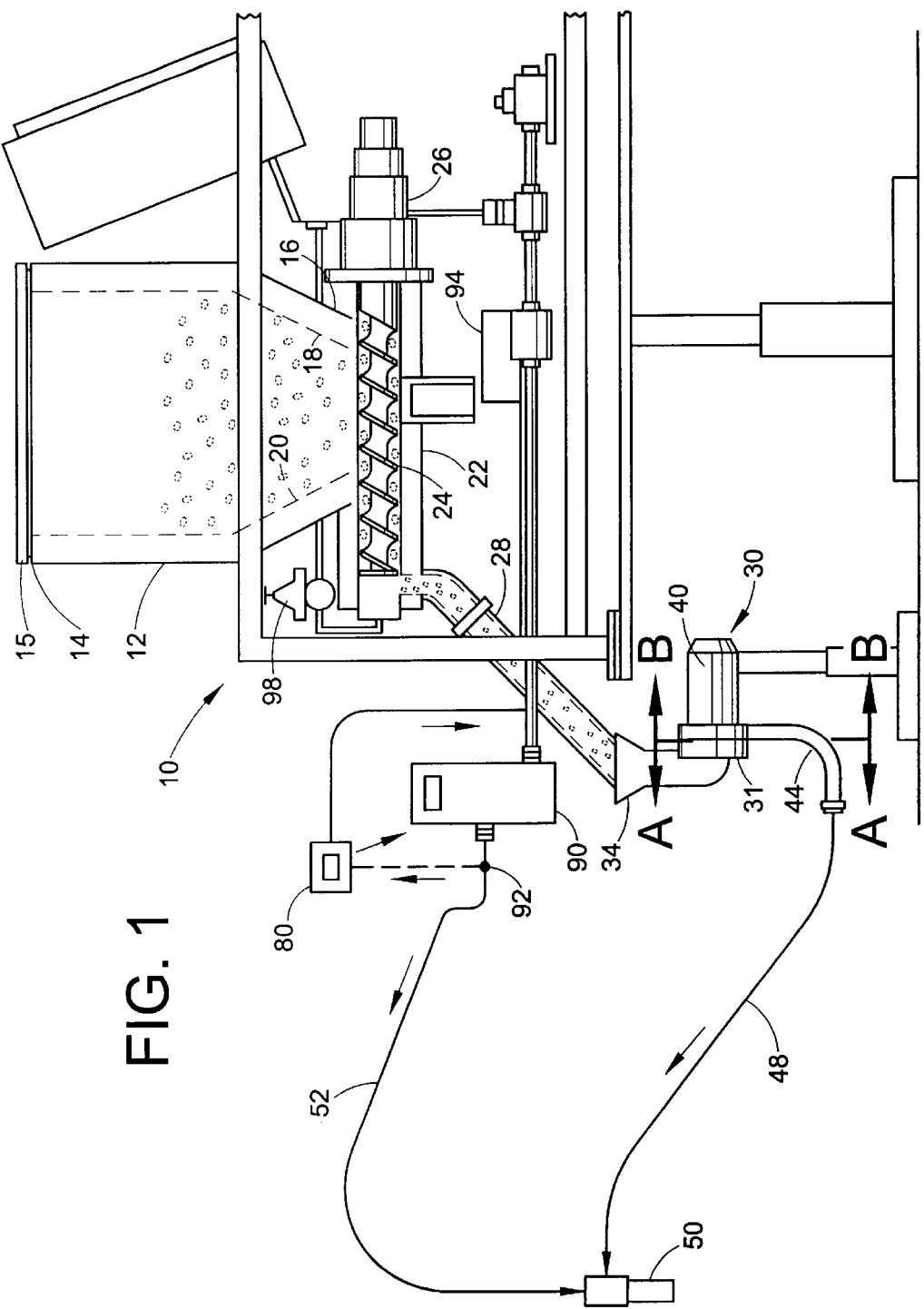
FIG. 1 is a schematic overall view of the apparatus of the present invention.

An overall layout of the system of this invention is shown in FIG. 1. With specific reference to the right-hand side of FIG. 1, the system includes feeder device, designated generally by reference numeral 10, capable of providing a supply of dry ice pieces. Feeder device 10 includes a hopper 12 having an open top portion 14 supporting a hinged cover 15, a bottom portion 16, two side walls (not shown), and end walls 18, 20. Hopper 12 is of conventional design, with the opposite side walls and the end walls 18, 20 being inclined toward each other from top portion 14 to bottom portion 16. Feeder device 10 also includes a feed cylinder 22 connected to bottom portion 16 of hopper 12 and in communication with the interior of hopper 12. Feed cylinder 22 preferably is vented to the atmosphere and contains an augur 24 that is rotated by a motor 26, which may be electrically, hydraulically, or pneumatically powered. A supply of dry ice pellets produced by a conventional pelletizer is held in hopper 12. The sizes of these pellets may range from about 1 mm to about 20 mm in diameter.

As stated above, hopper 12 is in communication with feed cylinder 22. Consequently, pellets placed in hopper 12 are fed by gravity into feed cylinder 22. When augur 24 is rotated, the pellets in cylinder 22 are moved by the augur blades to one end of cylinder 22 (the left-hand end in FIG. 1), where they drop out of the cylinder 22 through an output duct 28. An aperture (not shown) with a diameter slightly greater than the outer diameter of blades of augur 24 is provided in forward end wall 20 to enable the pellets to move past wall 20 to output duct 28 in a controlled fashion.

In accordance with the invention, the lower end of output duct 28 is connected to the input side of a size-reducing mill 30. In the embodiment shown in FIG. 1, mill 30 is a conventional knife mill normally used to reduce the size of various materials, such as minerals, ores, building materials, plastics, cellulose, paper, leather, animal feed, and cloth. An example of this type of size-reducing mill that has proved suitable for use with dry ice pellets is the Cross Beater Mill marketed by Glen Mills Inc. of Clifton, N.J.

Figure 2:
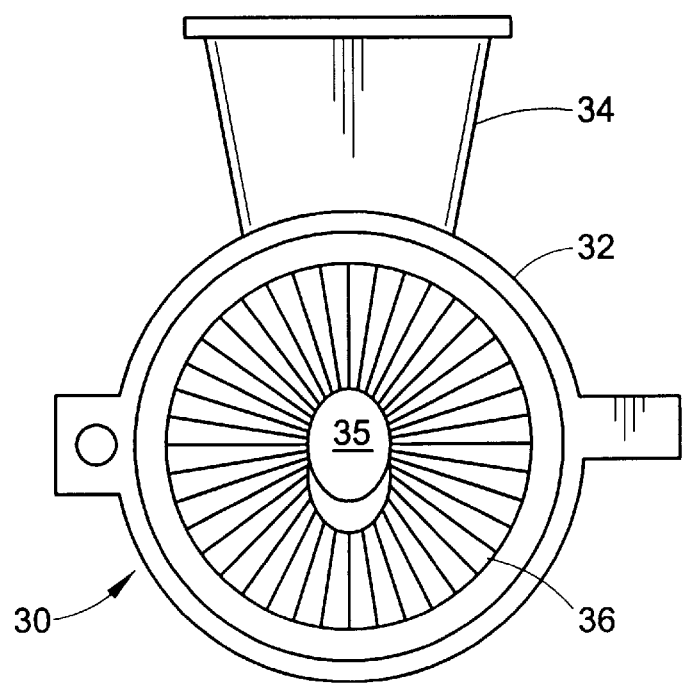
FIGS. 2(a) and 2(b) are cross-sectional views of one embodiment of the pellet-size reducer used in the apparatus of the invention, taken along lines A—A and B—B, respectively, in FIG. 1.
Figure 2:
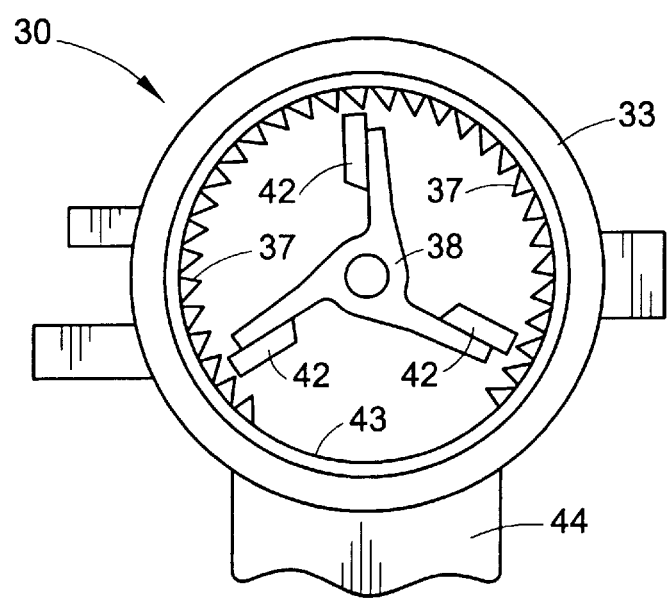

Mill 30 includes a generally cylindrical housing 31 that, as shown in greater detail in FIGS. 2(a) and 2(b), is comprised of housing portions 32 and 33, which preferably are connected by a hinge mechanism. An input chute 34 is incorporated into housing portion 32 and communicates with the interior of housing 31 via opening 35 Input chute 34 is connected to output duct 28 so that dry ice pellets dropping out of feed cylinder 22 through output duct 28 are fed into the interior of housing 31 via input chute 34 and opening 35. Preferably, the interior of housing 31 is vented to the atmosphere.

A first series of serrations 36 are formed on the interior face of housing portion 32, and a second series of serrations 37 are formed on the inner circumferential surface of housing portion 33. A rotor 38 disposed within housing portion 32 is connected to and rotated by motor 40, which may be electrically, hydraulically, or pneumatically powered. Mounted on each arm of rotor 38 is a knife blade 42. Rotation of rotor 38 by motor 40 causes the dry ice pellets fed to the interior of housing 31 to be sliced and crushed into smaller sizes by the interaction of knife blades 42 with serrations 36 and 37. The reduced-size dry ice pellets then exit the interior of housing 31 through an opening 43 provided in the housing portion 33 and connecting to exit chute 44. Preferably, an operator selectable sizing screen (not shown) is positioned across opening 43 to limit the particle size of the material produced by the mill. For applications in the electronic circuit industry, as an example, the sizing screen preferably is selected from a set of screens having web densities that permit only pellets of a diameter of about 100 microns or less to pass through the screen into exit chute 44.

The exit chute 44 of mill 30 in turn is connected by a flexible hose 48 to the blast nozzle or blast gun 50. Preferably, hose 48 is insulated to limit sublimation of the dry ice pellets before they reach the blast gun and has a smooth bore to minimize flow resistance between the mill and the blast gun. The exit chute of mill 30 also can be provided with a magnet (not shown) to retain metal particles that might result from the grinding process and prevent them from being conducted to the blast gun.

Gun 50 also is connected to a gas stream source by a flexible hose 52. The gun is operable when coupled to a gas stream to dispense dry ice particles according to the well known venturi principle in a manner described in more detail below. The gas stream preferably is compressed air supplied by a conventional air compressor (not shown). As an alternative, especially in locations where access to electrical power is a problem or in clean-room applications where possible contamination from air-borne particles is a concern, the gas stream supplied through flexible hose 52 can be nitrogen or carbon dioxide gas from a reservoir of liquid nitrogen or liquid $CO_2$.

Figure 3:
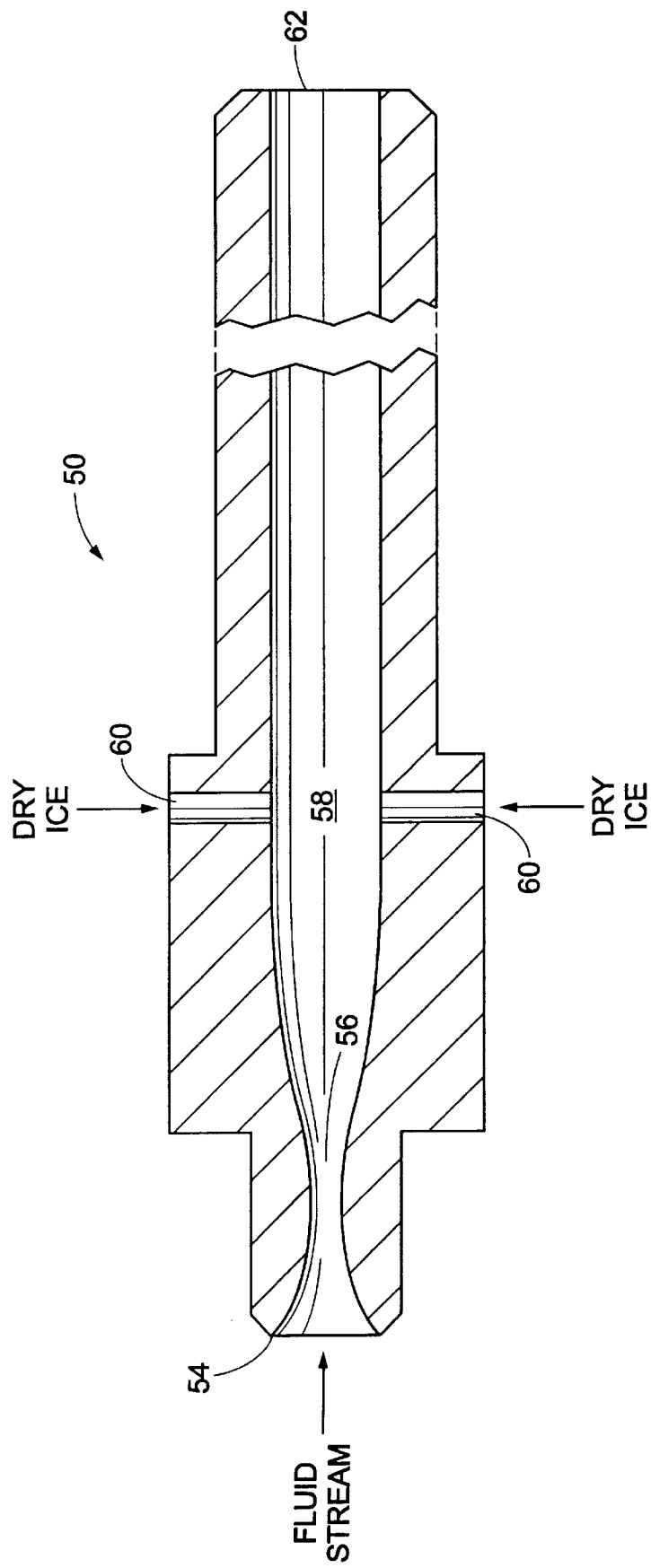
FIG. 3 is a cross-sectional view of the blast gun used with the present invention.

The preferred form of gun 50 is shown in FIG. 3. The gas stream from hose 52 enters the input end 54 of gun 50 and is constricted by venturi 56. As a result of passing through the venturi, the pressure of the gas stream is substantially decreased in mixing section 58 of the gun. The shape of the venturi and the transition to mixing section 58 should be selected to result in a pressure less than atmospheric pressure in section 58.

Communicating with section 58 are a pair of ports 60, which are connected to hose 48. Because the dry ice supplied by the feed cylinder 22 and grinding mill 30 is at atmospheric pressure, the lowered pressure in section 58 draws the dry ice particles produced by mill 30 through hose 48 and into the gas stream passing through section 58 of gun 50. The $CO_2$ particles become entrained in the gas stream and exit end 62 of the gun, where they impact on the surface to be cleaned.

Ports 60 preferably are in line with each other so that the dry ice particles entering section 58 from opposite sides collide with each other, possibly further reducing the size of the dry ice particles exiting the gun at end 62. Generally, this additional reduction in size will apply only to the larger particles, as the probability of particles colliding with each other decreases with decreased size. The dry ice particles exiting gun 50 under this system are substantially smaller than the pellets fed into hopper 12. Consequently, these particles are far better adapted to the layer-removal needs of the electronics industry than conventional dry ice pellet blasting systems.

It also is important to minimize the incidence of electrostatic charges on the electronic circuitry being processed by the above-described system. Accordingly, the system preferably includes means for selectively controlling the humidity of the gas stream connected to gun 50. Humidity control is accomplished by a water injector 80 (see FIG. 1) connected to the conduit supplying the gas stream to gun 50. A variety of commercial atomized water-injection systems are available for use in the system of the invention. In the alternative, a supply of water in a finely porous plastic or stainless steel pod can be located in the gas stream, with the flow of air or other propellant gas over the surface of the pod extracting moisture through the porous surface. The addition of water vapor to the gas stream provides a path by which electrostatic charges can be grounded.

In many applications, it also is desirable to control the temperature of the gas stream by heating the (,as stream. This is particularly important when water is being added to the gas stream to control electrostatic charges. In the absence of gas heating, the dry ice pieces will cool the gas stream and cause unwanted condensation of the water vapor. In addition, certain electronic components can be damaged by exposure to extremely low temperatures, and $CO_2$ pellets can drop the temperature of a compressed air stream to as low as $-100°$ F. Accordingly, in the preferred embodiment the gas-stream temperature is selectively controlled by heater 90, which is connected to the gas stream downstream of water injector 80. Injector 80 preferably monitors the humidity of the gas stream at point 92 downstream of heater 90. Heater 90 preferably is an electric trim heater such as the Model TT-9 heater sold by Thermax Inc.

The amount of humidity and/or heat that should be added to the gas stream depends on the particular conditions that exist, particularly the composition of the gas stream and the nature of the work piece being cleaned or blasted. Most electronic components, for example, can safely withstand temperatures down to about $-55°$ F., so the gas stream preferably is heated so that it is maintained above that temperature at the workpiece surface. Of course, the temperature level necessary to avoid condensation of water vapor when combined in the gun with dry ice pieces will depend on the humidity level of the gas stream. Under most conditions, the gas stream temperature need not be raised above about $150°$ F. at point 92 to avoid excess condensation. For inhibiting electrostatic discharge in typical situations, the dew point of the gas stream following heating (e.g., at point 92 of FIG. 1) preferably should be in the range of $40–80°$ F. The amount of water that must be added to achieve that dew point range will heavily depend on whether the gas stream supply is compressed air or a gas provided from a supply of cryogenic liquid. The dew point readings for typical unconditioned gas streams range from $-40°$ F. for compressed air to $-100°$ F. for nitrogen gas.

The volume flow of the gas stream also should be controlled, preferably by sensing and controlling the gas stream pressure. The gas stream pressure affects a number of parameters, such as the speed of the dry ice particles entering the gun at section 58 as well as the speed of the particles exiting the gun. Different pressures must be used for different layer-removal conditions, including the type of material being removed and the thickness of the material. The apparatus shown in FIG. 1 is operable within a pressure range as wide as 10–350 psi, but in normal blasting operations gas stream pressure usually is 30–150 psi. Pressure is controlled by ball valve 94 regulator, which automatically controls gas stream flow to result in a preset pressure.

The above-noted preferred values for gas-stream humidity, temperature, and pressure, of course, will not apply to all situations. The more fragile or sensitive the workpiece is, the more care must be taken in optimizing these gas-stream parameters to effectuate material removal while avoiding damage to the workpiece.

In certain clean-room applications of this invention, it also might be desirable to isolate the surface being cleaned from air-borne contaminants. In such applications, nitrogen or carbon dioxide gas is used to provide the propellant stream, and the top of hopper 12 is subjected to an inert-gas blanket, using the same gas as for the propellant stream, at an elevated pressure to prevent air from entering the system. In these applications, a zero-pressure regulator 98 is connected to hopper 12. When regulator 98 senses that the inert-gas pressure within the hopper drops to a predetermined minimum, the system supplying the inert-gas blanket (not shown) is actuated to increase the supply of inert gas to prevent the entrance of ambient-pressure air into the gas system. The blast gun operates in the same manner as described above, with venturi 56 creating a low-pressure region at 58 to draw dry ice particles from the elevated-pressure hopper. In this application, mill 30 preferably is sealed to prevent contamination from the ambient atmosphere.

Finally, when this system is employed in the context of removing layers of materials from printed circuit boards and the like, gun 50 preferably is mounted on a precision X-Y table or on a movable gantry or robot mechanism so that movement of the gun relative to the workpiece and, consequently, the material removal process can be numerically controlled.

Figure 4:
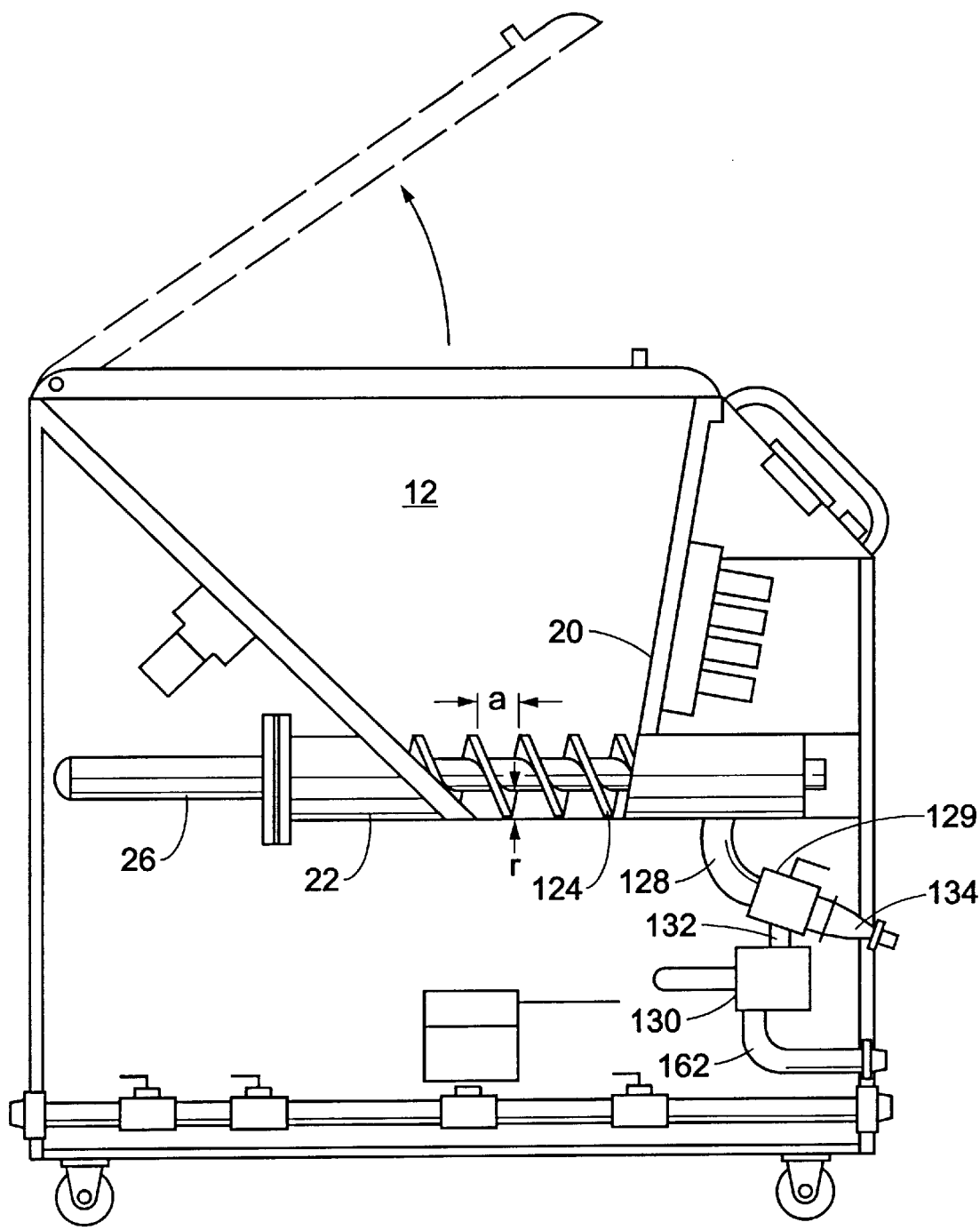
FIG. 4 is a schematic view of a portion of a second embodiment of the apparatus of the invention.

A second embodiment of the system of the invention is shown in FIG. 4. This embodiment of the invention is similar to that shown in FIG. 1, with a hopper 12 feeding dry ice particles by gravity into feed cylinder 22. In this embodiment of the invention, however, the systems is adapted to receive "nuggets" of dry ice having dimensions substantially larger than the dimensions normally associated with $CO_2$ pellets, yet it can produce particles at the associated blast gun that are on the order of 100 microns in size or smaller. For example, hopper 12 in this second embodiment of the invention can be filled with rods of dry ice having diameters in the range of 20 mm and lengths up to about 10 cm. Such rods are readily produced by extrusion with a pelletizer having a die with 20 mm diameter orifices.

In accordance with the invention, an initial reduction in the size of the $CO_2$ particles takes place in cylinder 22. In the embodiment shown in FIG. 4, the augur 124 mounted within cylinder 22 has a predetermined radial clearance "r" between its root diameter and the wall of cylinder 22 and a predetermined axial clearance "a" between adjacent augur blades that prevents pieces of dry ice larger than about 20 mm from being conveyed past the aperture (not shown) in the forward end wall 20 of hopper 12 as the augur turns. Instead, pieces of dry ice larger than 20 mm are broken into smaller pieces by their interaction with augur 124, the hopper wall 20, and other dry ice nuggets. In the presently preferred embodiment, "r" is about 14 mm and "a" is about 19 mm.

The dry ice pieces that are conveyed (to the right in FIG. 4) by augur 124 past end wall 20 of hopper 12 then drop out of cylinder 22 into output duct 128, which is shorter than the duct 28 shown in FIG. 1 to provide for a more compact blasting apparatus. Mounted at the end of duct 128 is a three-way valve 129, which selectively operable to connect duct 128 to grinding mill 130 via conduit 132 or directly to outlet 134.

Figure 5:
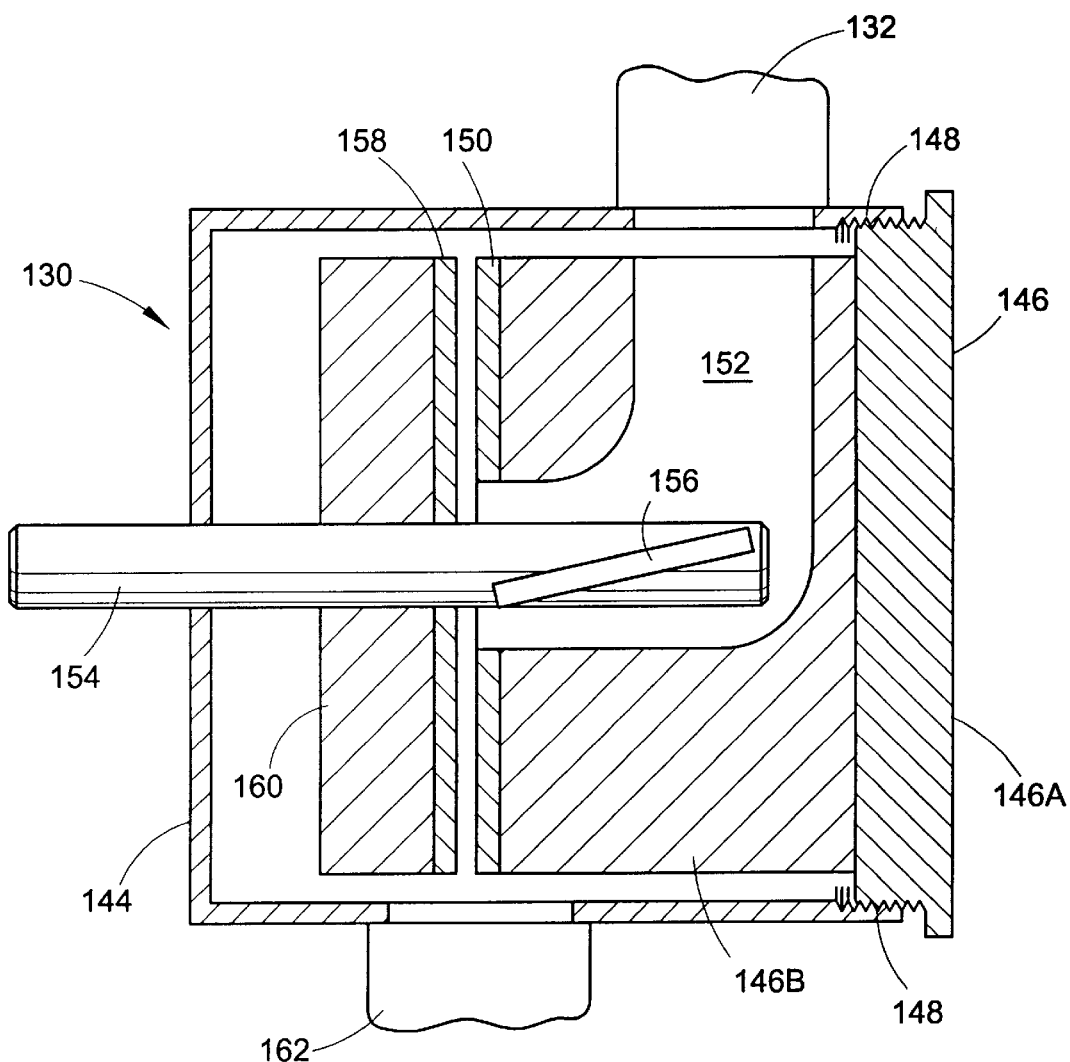
FIG. 5 is a cross-sectional view of a second embodiment of the pellet-size reducer used in the apparatus of the invention.

A schematic cross-sectional view of grinding mill 130 is shown in FIG. 5. The mill includes a main housing 144 suitably connected to a stationary disc support 146, preferably by threads 148. Stationary disc support 146 includes a first portion 146A that rotates relative to housing 144 and a second portion 146B that moves only linearly, being restrained from rotating by a key (not shown) that engages with a slot (not shown) in housing 144. The two portions 146A and 146B are connected by a bearing (not shown). Affixed to disc support 146 is stationary grinding disc 150. An L-shaped feed chamber 152 is defined within disc support 146. Chamber 152 is in communication with conduit 132, from which it receives dry ice nuggets falling out of the end of cylinder 22.

A shaft 154 is rotationally supported by housing 144 and is driven by a motor (not shown), preferably a pneumatic motor. One end of shaft 154 is disposed within chamber 152 and includes one or more flutes 156 that convey the dry ice nuggets out of chamber 152 as shaft 154 rotates. The dry ice nuggets are conveyed by flutes 156 toward the left in FIG. 4 and between stationary grinding disc 150 and a complementary grinding disc 158. Disc 158 is supported by rotational disc support 160 and rotates with shaft 154. Grinding discs 150 and 158 preferably are formed from steel and include on their opposing faces a series of helical grinding blades (not shown).

The threaded connection between housing 144 and stationary disc support 146 enables adjustment of the clearance between grinding discs 150 and 158. Dry ice nuggets that enter the space between the two discs from chamber 152 are ground into smaller pieces by the discs and are conveyed through outlet 162 into a flexible conduit and, ultimately, into a blast gun such as that shown in FIG. 2. The low pressure formed in the blast gun ensures that the air stream or other gas medium conducts the ground $CO_2$ pellets out of the mill and toward the blast gun.

Grinding mill 130 preferably is an adjustable disc mill such as the Model No. S.500 disc mill sold by Glen Mills Inc. that can produce particles with a preselected nominal diameter between 250 and 1000 microns. The adjustability of mill 130 enables the user to control the size of the dry ice pellets being fed to the blast gun at the cleaning site without regard to the size of the dry ice pieces in the hopper. Either relatively large $CO_2$ nuggets or conventional rice-sized pellets can be used as the starter material. This adjustability permits increased flexibility of use. The user no longer needs to transport a supply of specifically sized $CO_2$ pellets to the work site; control of pellet size can be accomplished in the field. The ability of disc mill 130 to adjust $CO_2$ particle size by varying the distance between the grinding discs also enables the elimination of the sizing screen used with the knife mill 30 described with reference to FIG. 1.

If the cleaning application requires use of substantial quantities of conventional, rice-sized dry ice pellets, the apparatus of FIG. 3 also can be used. In such an application, the pellets are fed by hopper 12 into cylinder 22, and augur 124 conveys them past wall 121, where they drop down outlet duct 128. Ball valve 129 is used to connect output duct 128 to outlet 134, which in turn is connected to a blast gun. Previously sized dry ice pellets thus are fed to the blast gun without passing through the grinding mill. Thus, the same apparatus can be used for conventional blasting applications as well as for those requiring reduced-size dry ice pellets.

It will be apparent to those skilled in the art that other modifications and variations can be made in the method of and apparatus of the invention without departing from the scope of the invention. For example, to the extent that disc mill grinders or other grinders are adjustable to produce dry ice particles with nominal diameters less than the 1000–250 micron range for the Model No. S.500 mill, such mills could be used in the apparatus and method of the present invention. The invention in its broader aspects is, therefore, not limited to the specific details and illustrated examples shown and described. Accordingly, it is intended that the present invention cover such modifications and variations provided that they fall within the scope of the appended claims and their equivalents.

I claim:

1. An apparatus for removing surface coverings, comprising:

a feeder device capable of providing a supply of dry ice pieces;

a grinding mill operatively associated with said feeder device to receive dry ice pieces from said feeder device, said grinding mill reducing the size of the dry ice pieces to nominal diameters less than 1 mm; and a blast gun connected to said grinding mill and adapted for operative communication with an associated supply of flowing gas, said blast gun entraining the reduced-sized dry ice pieces into the flowing gas and directing the flowing gas and dry ice pieces to an associated surface covering to be removed.

2. The apparatus of claim 1, wherein said grinding mill is a disc mill.

3. The apparatus of claim 1, wherein said grinding mill is a knife mill.

4. The apparatus of claim 3, wherein said knife mill includes a sizing screen.

5. The apparatus of claim 1, further comprising a humidifier operatively associated with said blast gun to add moisture to the flowing gas directed by said blast gun.

6. The apparatus of claim 5, further comprising a temperature controller operatively associated with said blast gun and said humidifier to control the temperature of the flowing gas directed by said blast gun.

7. An apparatus for removing surface coverings, comprising:
   dry ice supply means for providing a supply of dry ice pieces;
   reducing means, operatively associated with said dry ice supply means and receiving dry ice pellets from said dry ice supply means, for reducing the size of the dry ice pieces to nominal diameters less than 1 mm;
   a blast gun connected to said reducing means and adapted for operative communication with an associated supply of flowing gas, said blast gun entraining the reduced-sized dry ice pieces into the flowing gas and directing the flowing gas and dry ice pieces to an associated surface covering to be removed.

8. The apparatus of claim 7, wherein said reducing means includes a grinding mill.

9. The apparatus of claim 8, wherein said grinding mill is a disc mill.

10. The apparatus of claim 8, wherein said grinding mill is a knife mill.

11. The apparatus of claim 7, further comprising means for adding moisture to the flowing gas directed by said blast gun.

12. The apparatus of claim 11, further comprising means for controlling the temperature of the flowing gas directed by said blast gun.

13. An apparatus for removing surface coverings, comprising:
   a feeder device capable of providing a supply of dry ice pieces;
   an adjustable grinding mill operatively associated with said feeder device to receive dry ice pieces from said feeder device, said grinding mill reducing the size of the dry ice pieces to a preselected maximum diameter; and
   a blast gun connected to said grinding mill and adapted for operative communication with an associated supply of flowing gas, said blast gun entraining the reduced-sized dry ice pieces into the flowing gas and directing the flowing gas and dry ice pieces to an associated surface covering to be removed.

14. The apparatus of claim 13, wherein said adjustable grinding mill includes an adjustable disc grinding mill.

15. The apparatus of claim 13, wherein said adjustable grindings mill reduces the size of the dry ice pieces to a preselected maximum diameter between 250 µm and 1 mm.

16. An apparatus for removing surface coverings, comprising:
   a supply of flowing gas;
   a feeder device capable of providing a supply of dry ice pieces;
   a grinding mill operatively associated with said feeder device to receive dry ice pieces from said feeder device, said grinding mill reducing the size of the dry ice pieces to nominal diameters less than 1 mm; and
   a blast gun having a primary flow path defined by an inlet connected to said flowing-gas supply, an outlet, a venturi intermediate said first inlet and said outlet, and at least one dry ice port connected to said pellet-size reducer and opening into said primary flow path intermediate said venturi and said outlet, whereby the pressure of gas flowing from said inlet to said outlet decreases proximate the position where said dry ice port opens into said primary flow path and causes the reduced-sized dry ice pieces to be drawn through said dry ice port into said primary flow path and to exit said outlet entrained in the flowing gas.

17. The apparatus of claim 16 where in said grinding mill is a disc mill.

18. The apparatus of claim 16, wherein said grinding mill is a knife mill.

19. The apparatus of claim 16, wherein said flowing-gas supply includes an air compressor.

20. The apparatus of claim 16, wherein said flowing-gas supply includes a vaporizer adapted for operative communication with an associated cryogenic supply of liquefied gas.

21. The apparatus of claim 16, wherein said feeder device and said grinding mill are vented to atmospheric pressure.

22. The apparatus of claim 16, wherein said feeder device includes a hopper, said hopper being subjected to an inert-gas blanket of a predetermined minimum pressure greater than atmospheric pressure.

23. The apparatus of claim 16, further comprising a humidifier operatively associated with said flowing gas supply and said blast gun to add moisture to the gas flowing through said primary flow path of said blast gun.

24. The apparatus of claim 23, wherein said humidifier includes a water injector disposed upstream of said blast gun.

25. The apparatus of claim 23, wherein said humidifier includes a reservoir of water having a porous surface area along which gas from said flowing-gas supply flows upstream of said blast gun.

26. The apparatus of claim 23, wherein said humidifier includes a humidity detector to measure the humidity of the gas upstream of said blast gun.

27. The apparatus of claim 23, further comprising a temperature controller operatively associated with said flowing gas supply, said humidifier and said blast gun to control the temperature of the gas flowing through said primary flow path of said blast gun.

28. An apparatus for removing surface coverings, comprising:
   a supply of flowing gas;
   a feeder device capable of providing a supply of dry ice pieces;
   a grinding mill operatively associated with said feeder device to receive dry ice pieces from said feeder device, said grinding mill reducing the size of the dry ice pieces to nominal diameters less than 1 mm; and
   a blast gun having a primary flow path defined by an inlet connected to said flowing-gas supply, an outlet, a venturi intermediate said inlet and said outlet, and a pair of opposed dry ice ports connected to said grinding mill and opening into said primary flow path intermediate said venturi and said outlet, whereby the pressure of gas flowing from said inlet to said outlet decreases proximate the position where said dry ice ports open into said primary flow path and causes the reduced-sized dry ice pieces to be drawn through said dry ice ports into said primary flow path and to exit said outlet entrained in the flowing gas.

29. The apparatus of claim 28, wherein said dry ice ports have longitudinal axes orthogonal to the primary flow path.

30. An apparatus for removing surface coverings, comprising:

a supply of flowing gas;

a feeder device capable of providing a supply of dry ice pieces;

a blast gun connected to said feeder device and said flowing gas supply, said blast gun entraining the dry ice pieces into the flowing gas and directing the flowing gas and dry ice pieces to an associated surface covering to be removed; and a humidifier operatively associated with said flowing gas supply and said blast gun to add moisture to the flowing gas directed by said blast gun.

31. The apparatus of claim 30, wherein said humidifier includes a water injector disposed upstream of said blast gun.

32. The apparatus of claim 30, wherein said humidifier includes a reservoir of water having a porous surface area along which gas from said flowing-gas supply flows upstream of said blast gun.

33. The apparatus of claim 30, wherein said humidifier includes a humidity detector to measure the humidity of the gas upstream of said blast gun.

* * * * *

UNITED STATES PATENT AND TRADEMARK OFFICE
CERTIFICATE OF CORRECTION

PATENT NO. : 6,174,225
DATED : January 16, 2001
INVENTOR(S) : James R. Becker

Page 1 of 1

It is certified that error appears in the above-identified patent and that said Letters Patent is hereby corrected as shown below:

Claim 15, column 9, line 59, delete "grindings" and insert therefore --grinding--;

claim 17, column 10, line 15, delete "where in" and insert therefore --wherein--;

claim 27, column 10, line 47, delete "humidifier and " and insert therefore --humidifier, and--.

Signed and Sealed this

Fifth Day of June, 2001

*Attest:*

*Attesting Officer*

NICHOLAS P. GODICI

*Acting Director of the United States Patent and Trademark Office*